United States Patent
Sundaram et al.

(10) Patent No.: US 7,205,563 B2
(45) Date of Patent: Apr. 17, 2007

(54) QWIP WITH ELECTRON LAUNCHER FOR REDUCING DIELECTRIC RELAXATION EFFECT IN LOW BACKGROUND CONDITIONS

(75) Inventors: Mani Sundaram, Nashua, NH (US); Axel R Reisinger, Milford, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 38 days.

(21) Appl. No.: 10/803,295

(22) Filed: Mar. 18, 2004

(65) Prior Publication Data

US 2005/0205857 A1    Sep. 22, 2005

(51) Int. Cl.
*H01L 29/06* (2006.01)

(52) U.S. Cl. .................. 257/21; 257/17; 257/185

(58) Field of Classification Search .............. 257/17, 257/21, 184, 185; 250/338.4
See application file for complete search history.

(56) References Cited

U.S. PATENT DOCUMENTS

| | | | |
|---|---|---|---|
| 5,384,469 A | 1/1995 | Choi | |
| 5,459,332 A * | 10/1995 | Carruthers | 257/17 |
| 6,211,529 B1 | 4/2001 | Gunapala et al. | |
| 6,674,091 B2 * | 1/2004 | Gunapala et al. | 257/21 |

OTHER PUBLICATIONS

Gunapala, Sarath et al., "MQW Based Blocked Intersubband Detector for Low Background Operation", NASA Tech Briefs, Jul. 2001, pp. 1-2, NPO-21073, NASA's Jet Propulsion Laboratory, Pasadena, CA.

Bandara, Sumith et al., "Quantum Well Infrared Photodetectors for Low Background Applications", www.eps.org, Mar. 2001, p. 1, Jet Propulsion Laboratory.

Gunapala, S. et al., "Quantum Well Infrared Photodetector (QWIP) Focal Plane Arrays", Semiconductors and Semimetals, 1999, pp. 1-83, vol. 62.

Gunapala, S. et al., "640X486 Long-wavelength Two-color GaAs/AlGaAs Quantum Well Infrared Photodetector (QWIP) Focal Plane Array Camera", pp. 1-24.

Gunapala, S. et al., "640X512 Pixel Four-Band, Broad-Band, and Narrow-Band Quantum Well Infrared Photodetector Focal Plane Arrays", pp. 1-12.

PCT International Search Report dated May 26, 2006 of International Application No. PCT/US05/08121 filed Mar. 10, 2005.

* cited by examiner

*Primary Examiner*—Sara Crane
(74) *Attorney, Agent, or Firm*—Maine & Asmus

(57) ABSTRACT

A QWIP structure is disclosed that includes a graded emitter barrier and can further be configured with a blocked superlattice miniband. The graded emitter barrier effectively operates to launch dark electrons into the active quantum well region, thereby improving responsivity. A graded collector barrier may also be included for reverse bias applications. The configuration operates to eliminate or otherwise reduce image artifacts or persistence associated with dielectric relaxation effect in low-background applications.

13 Claims, 3 Drawing Sheets

QWIP WITH ELECTRON LAUNCHER FOR REDUCING DIELECTRIC RELAXATION EFFECT IN LOW BACKGROUND CONDITIONS

FIELD OF THE INVENTION

The invention relates to quantum well infrared photodetector (QWIP) technology, and more particularly, to a QWIP structure configured with a graded barrier for launching electrons from the emitter into the active quantum well region.

BACKGROUND OF THE INVENTION

A quantum well designed to detect infrared (IR) light is called a quantum well infrared photodetector (QWIP). QWIPs operate by photo-excitation of electrons between a ground state and an excited state of its quantum wells. In more detail, a quantum well absorbs IR photons. This absorption of IR photons photo-excite electrons from the ground state to the excited state of each quantum well. The excited states of the quantum wells making up a QWIP are close to or within an energy transport band (sometimes referred to as the continuum or a miniband). A voltage externally applied to the QWIP operates to sweep out the photo-excited electrons from the quantum wells, thereby producing a photocurrent in the continuum.

Quantum wells are grown in a crystal structure. In general, layers of two different, high-bandgap semiconductor materials are alternately grown. The bandgap discontinuity of the two semiconducting materials creates quantized subbands in the wells associated with conduction bands. Only photons having energies corresponding to the energy separation between the ground and excited states are absorbed. This is why a QWIP has such a sharply defined absorption spectrum. Note that each well can be shaped to detect a particular wavelength, and so that it holds the ground state near the well bottom, and the excited state near the well top.

FIG. 1 illustrates the conduction-band of a typical QWIP structure and its field distribution. As can be seen, the structure includes a GaAs emitter contact, a stack of quantum well and barrier layers, and a GaAs collector contact. A voltage is applied across the structure, with a ground state near the well bottoms, and an excited state near the well tops. In the stack area, electrons are generated because of light absorption by the wells. Electrons are also present at the emitter area, because it is a doped contact layer. However, there is no photo absorption at the emitter, as there are no quantum wells there. Thus, the only electrons that come from the emitter into the stack are dark electrons, often referred to as dark current.

Because there is no photocurrent generation to cause the electrons to flow from the emitter into the stack, other mechanisms must be used. In particular, the emitter electrons are provided to the stack by one of thermionic emission, tunneling, and thermally-assisted tunneling. Ideally, the field distribution across the device is uniform, as indicated by the constant slope from the emitter to the collector. In actuality, however, the current generated by thermionic emission, tunneling, or thermally-assisted tunneling is substantially smaller than the photocurrent generated by the wells. As such, the actual field distribution is not constant, but effectively adjusts itself to satisfy the requirements for a constant current flow through the device.

In more detail, the actual field distribution (shown as dashed line in FIG. 1) includes a high resistance junction between the emitter and the stack, where most of the device voltage is distributed, as indicated by the dashed line having the steeper slope. This high resistance point is sometimes referred to as the high field domain. The remainder of the voltage is distributed across the relatively lower resistance stack of the QWIP, as indicated by the dashed line having the less steep slope. In accordance with Ohms' Law, therefore, the current flow through the device remains constant, but only at the cost of a non-uniform field distribution.

One adverse consequence of the non-uniform field distribution is the dielectric relaxation effect, particularly in low temperature and low background conditions. More specifically, as a photo-excited electron is swept from a quantum well, it leaves a hole behind referred to as a space charge buildup. In low-background conditions, the high resistance of the high field domain causes delay in refilling the space charge buildup. In this sense, the resistive high field domain and the space charge build up operate to form an RC time constant. This RC time constant results in slow response times. For example, conventional QWIP designs having a large RC time-constant are associated with slow image glow build-up as well as slow image glow fade-out (or image persistence). In addition, such slow response times may render narrow light pulses undetectable by the QWIP.

One QWIP structure designed to overcome this problem separates the quantum wells in the structure using thin barriers, which creates a miniband due to a large overlap of subband wavefunctions. The holes or space charge buildup of depleted wells are quickly refilled with electrons by way of sequential resonant tunneling from the emitter contact layer. In addition, and similar to block impurity band detectors, a thick impurity free blocking barrier is placed between the active well region and the collector contact layer to suppress the dark current of the device. Although such a configuration solves the dielectric relaxation problem, peak sensitivity is weaker and the spectral response is significantly broadened. Such results can be highly undesirable.

What is needed, therefore, is a QWIP design that effectively eliminates or otherwise reduces the dielectric relaxation effect.

SUMMARY OF THE INVENTION

One embodiment of the present invention provides a quantum well infrared photodetector (QWIP) device. The device includes an emitter contact layer, and a stack including a number of quantum wells. Each well is sandwiched between barrier layers. An electron launcher is configured with a plurality of steps to enable dark electrons to move rapidly from the emitter contact layer into the stack. This effectively reduces the high field domain present at the first barrier, thereby reducing both resistance (R) and capacitance (C) of the QWIP. This cuts the RC time constant associated with the device, effectively reducing the dielectric relaxation effect, which is proportional to the RC time constant.

In one such embodiment, a first barrier in the stack is defined by a particular semiconductor material make-up, and each step of the electron launcher adds about 25% or less of that first barrier's make-up. Dark electrons can flow quickly up each step with relatively low resistance. Note that the number of the steps can be sufficiently high enough (where each step height is relatively low) that the electron launcher is effectively a ramp. The device can be configured, for example, as an indirect-gap type structure, and the quantum wells are GaAs and the barriers are AlGaAs. Alternatively, the device can be configured as a strained type structure, and the quantum wells are InGaAs, and the barriers are AlGaAs.

In another such embodiment, the quantum wells have a width of about 40 Å to 80 Å, and the barriers have a thickness of about 500 Å or more. The device may further include a collector contact layer that is proximate to a last barrier included in the stack. Here, the device may further include a second electron launcher configured with a plurality of steps to enable dark electrons to rapidly move from the collector contact layer into the stack, thereby reducing dielectric relaxation effect during reverse bias applications. The device may further include a blocking layer between the stack and the collector contact layer for suppressing tunneling current from the quantum wells.

Another embodiment of the present invention provides a QWIP device that includes an emitter contact layer, and a stack that includes a superlattice structure of quantum wells. Each well is sandwiched between thin barrier layers that allow tunneling between the wells, thereby enabling rapid refilling of depleted wells and neutralization of space charge buildup. In addition, an electron launcher is configured with a plurality of steps to enable dark electrons to move rapidly from the emitter contact layer into the stack, thereby reducing dielectric relaxation effect.

In one such embodiment, a first barrier in the stack is defined by a particular semiconductor material make-up, and each step of the electron launcher adds about 25% or less of that first barrier's make-up. The electron launcher operates as a staircase or ramp, depending on the number of steps. The device can be configured, for example, as an indirect-gap type structure, and the quantum wells are GaAs and the barriers are AlGaAs. Alternatively, the device can be configured as a strained type structure, and the quantum wells are InGaAs, and the barriers are AlGaAs.

In another such embodiment, the quantum wells have a width of about 60 Å to 90 Å, and the barriers have a thickness of about 45 Å to 65 Å. The device may further include a collector contact layer that is proximate to a last barrier included in the stack. Here, the device may further include a blocking layer between the stack and the collector contact layer for suppressing tunneling current from the quantum wells.

Another embodiment of the present invention provides a QWIP device that includes a stack including a number of quantum wells, with each well sandwiched between barrier layers. In addition, an electron launcher is configured with a plurality of steps to enable dark electrons to move rapidly from a contact layer (e.g., either the emitter or the collector contact layer) into the stack, thereby reducing dielectric relaxation effect. In one such embodiment, a first barrier in the stack is defined by a particular semiconductor material make-up, and each step of the electron launcher adds about 25% or less of that first barrier's make-up.

The device may further include a blocking layer that is proximate to an end barrier of the stack for suppressing tunneling current from the quantum wells. The stack can be configured to detect multiple wavelengths (e.g., two colors within the mid wavelength IR spectrum, or one color from the long wavelength IR spectrum and another color from the very long wavelength IR spectrum). The device may further include an emitter contact layer that is proximate to a first end barrier of the stack, and a collector contact layer that is proximate to a second end barrier of the stack.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Embodiments of the present invention provide a QWIP design that effectively eliminates or otherwise reduces the dielectric relaxation effect, thereby enhancing QWIP responsivity. This can be achieved by providing a staircase or ramp from the emitter to the active quantum well region, which acts as a low resistance mechanism for launching electrons from the emitter into active quantum well region. As such, the typically high resistance point between the emitter and the active quantum well region is effectively lowered. Having reduced the dominant resistance component of the overall QWIP resistance, the active quantum well region can be configured with thicker barriers, which enable a desirable sharp spectral response. In short, grading the barrier at the emitter to launch electrons, both lowers the choke point resistance dramatically as well as restores detector sensitivity.

The present invention has many applications. For example, QWIPs configured with an electron launcher can be implemented in medium wave IR focal plane arrays used in low temperature (e.g., 80K), low background conditions. By grading the emitter barrier, high resistance associated with the high field domain is reduced. Note that the high field domain is typically at the emitter end and/or distributed at light minima in the pixel cavity. In addition, capacitance dominated by the width of high field domain is reduced. By reducing this RC time constant associated with the high field domain, the related undesirable image artifacts are eliminated.

Numerous other applications, such as short wavelength IR, long wavelength IR, and very long wavelength IR applications are possible here as well. In addition, the detector can be configured to detect multiple wavelengths (e.g., 2-color array), such as both long wavelength IR and very long wavelength IR. In such a configuration, the stack might include a first set of well-barrier periods configured for detecting a first frequency, and a second set of well-barrier periods configured for detecting a second frequency. The first and second sets of well regions could be separated by a heavily doped contact layer as is conventionally done.

Basic QWIP with Electron Launcher

Figure 1:
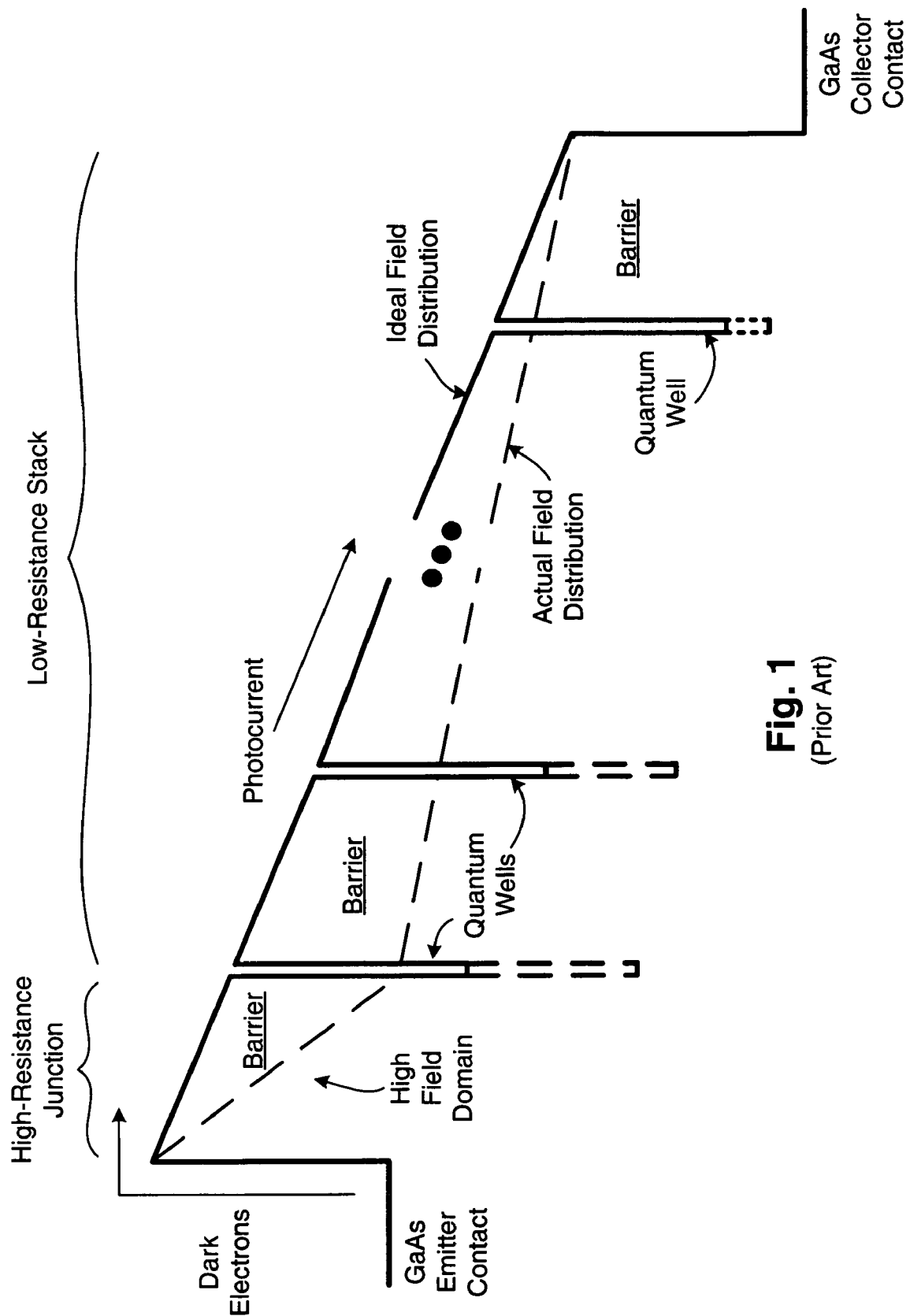
FIG. 1 is a conduction-band diagram of a QWIP device, showing ideal field distribution and actual field distribution.
Figure 2:
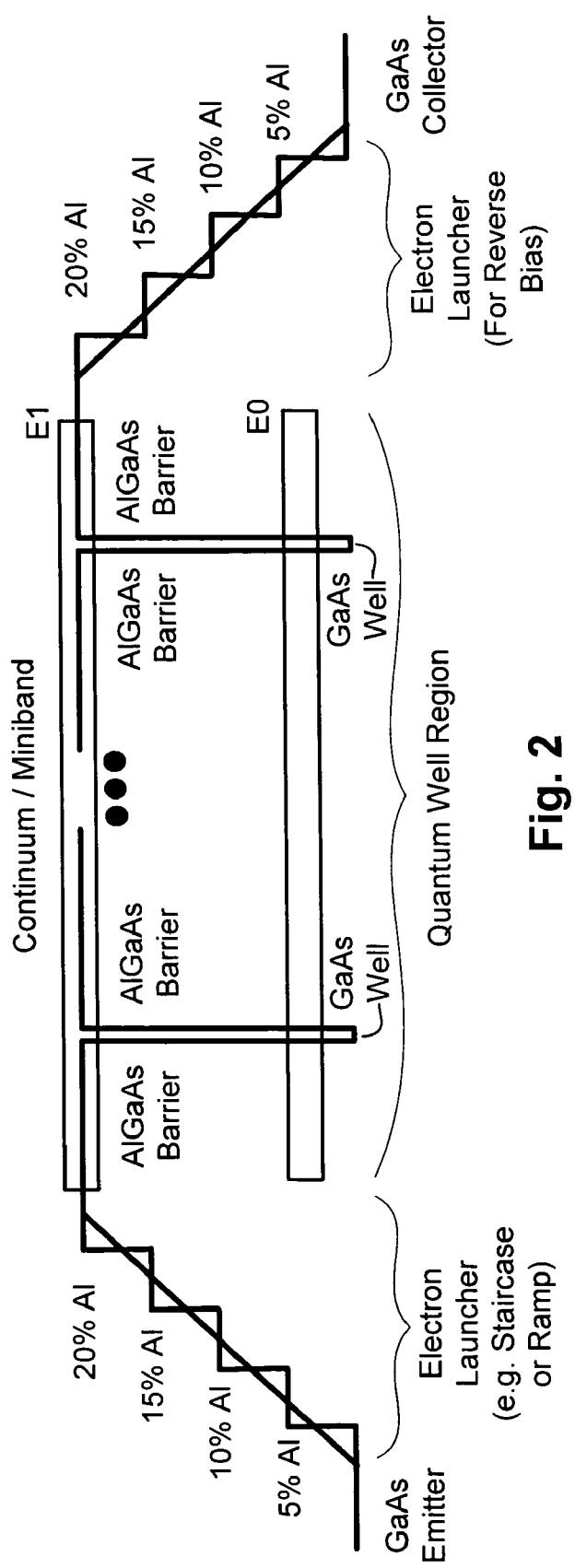
FIG. 2 is an energy-level diagram of a QWIP device configured with electron launching capability in accordance with one embodiment of the present invention.

FIG. 2 is an energy-level diagram of a QWIP device configured with electron launching capability in accordance with one embodiment of the present invention. As can be seen, the QWIP includes a GaAs emitter contact layer, an electron launcher, a GaAs collector contact layer, and a continuum or miniband made up of a number of GaAs quantum wells, with each well sandwiched between two AlGaAs barrier layers. Note that the well and barrier section of the device is sometimes referred to herein as the stack.

Further note that the QWIP can be optionally configured with an electron launcher at the collector contact, for reverse bias applications (i.e., when electrons are launched from the collector end and flow from collector to emitter), if so desired.

As previously explained, a QWIP operates by photo-excitation of electrons between a ground state (E0) and an excited state (E1) of its quantum wells. The absorption of IR photons photo-excite electrons from the ground state to the excited state of each quantum well. The excited states of the quantum wells making up a QWIP reside close to or within the continuum or miniband of energy states above the quantum wells. A voltage externally applied to the QWIP operates to sweep out the photo-excited electrons from the quantum wells, thereby producing a photocurrent in the continuum.

In this example, the electron launcher at the emitter is graded to form a staircase or ramp, where each ascending step of the staircase has a higher Aluminum content than the last. Thus, the last step of the staircase has an Aluminum content that is relatively close to the Aluminum content of the first AlGaAs barrier. Here, the Aluminum content is increased by about 5% per step, with a total of four steps. Thus, the Aluminum content of the first barrier (as well as the other barriers included in the stack) is about 20% to 25%. Note that the optional electron launcher at the collector contact layer can be configured similarly for the reverse bias case.

The electron launcher configured in accordance with the principles of the present invention is not intended to be limited to the example embodiment shown, but can be implemented in many configurations. For example, the graded electron launcher can be fabricated with any semiconductor materials that will facilitate transfer of dark electrons from the emitter into the quantum well stack. Thus, the electron launcher semiconductor material make-up will initially match or be within an acceptable percentage of the emitter contact layer make-up, and then gradually change to match or be within an acceptable percentage of the first stack barrier make-up. Various lattice matched material systems can be used here, and the electron launcher is graded accordingly.

In the example shown, the initial make-up or first step of the emitter launcher includes about 0% to 25% of the Aluminum content included in the first stack barrier make-up. The second step of the emitter launcher includes about 25% to 50% of the Aluminum content included in the first stack barrier make-up. The third step of the emitter launcher includes about 50% to 75% of the Aluminum content included in the first stack barrier make-up. The fourth and final step of the emitter launcher includes about 75% to 100% of the Aluminum content included in the first stack barrier make-up. The dark electrons rapidly flow from step to step of the electron launcher and into the stack with relatively low energy.

Note that the step resolution of the electron launcher can be adjusted as desired. In one particular embodiment, the number of steps is substantially high (20 steps or more), such that the electron launcher is effectively a ramp, where each step is small enough to allow dark electrons to flow from the emitter into the stack with relatively little resistance compared to larger steps. The number of steps in the electron launcher staircase depends on factors such as the desired manufacturing complexity, intended application, and the desired responsivity. Generally stated, the resistance, capacitance, RC time constant, and the dielectric relaxation effect all decrease as the number of steps increases. Responsivity also increases due to a higher average field across the quantum well stack resulting from the reduction in launch resistance.

Further note, however, that improvements in responsivity become slighter with increased step resolution beyond a certain point. Thus, a trade between increased manufacturing complexity (due to high step resolution) and marginal improvements in responsivity should be considered. Generally, a step resolution of 25% or higher (where each step adds about 25% or less of the first barrier's make-up) will provide desirable response times in most applications.

The number of quantum wells in the stack can vary, but is typically about 20 to 40 wells. In some applications, the number of quantum wells is lower (e.g., 4 to 10). Reducing the number of quantum wells allows the avalanche effect to be exploited. In particular, photocarrier avalanching can be used to make the photoconductive gain greater than 1, thereby improving the detector's external quantum efficiency. In any case, the number of barriers is generally one more than the number of wells. An avalanche QWIP design is discussed in detail in U.S. Application Ser. No. 10/781, 523, filed Feb. 18, 2004, titled "QWIP with Enhanced Optical Coupling", which is herein incorporated in its entirety by reference for all that it discloses regarding optical coupling and efficiency.

The geometry of the wells and barriers can vary also, depending on the application and materials used. For instance, in the example shown in FIG. 2, the lattice matched GaAs/Al$_x$Ga$_{1-x}$As material system is used. The bandgap of Al$_x$Ga$_{1-x}$As can be changed by varying x (between 0 and 1), which in turn varies the height of the well and the barriers (based on the Al molar ratio of the Al$_x$Ga$_{1-x}$As alloy). By changing the width and height of the wells, the detector's target frequency can be set (e.g., short wavelength IR, 1–3 µm; medium wave IR, 3–5 µm; long wavelength IR, 8–12 µm; very long wavelength, greater than 12 µm).

In addition, the thickness of the barriers can be selected to reduce or eliminate tunneling of dark current and to enable a sharp spectral response. In one particular long wavelength IR (LWIR) embodiment, x is about 0.3 and there are 40 GaAs wells, where the width of the wells is about 60 Å, and the thickness of the barriers is about 600 Å. The wells and contact layers are doped as conventionally done to facilitate photocurrent generation.

It will be appreciated in light of this disclosure that numerous embodiments and variations of the present invention are possible. For instance, material systems other than GaAs/Al$_x$Ga$_{1-x}$As, such as Al$_x$Ga$_{1-x}$As/In$_y$Ga$_{1-y}$As, may be used to implement the QWIP structure. The specific semiconductor materials and geometries used depend on the specific wavelengths to be detected. The semiconductor materials may be, for example, quantum-well inter-sub band materials, from among Groups II, III, IV, V and VI from the periodic table (e.g., GaAs/AlGaAs and AlGaAs/InGaAs). The emitter and collector contact layers can each be implemented, for example, as n-GaAs, with contact points covered in gold or palladium. Note that the structure can be created by conventional epitaxial growth of the various layers of semiconductor material upon a semiconductor substrate followed by selective removal of material using various etch techniques (wet and dry).

Blocked Superlattice Miniband QWIP with Electron Launcher

Figure 3:
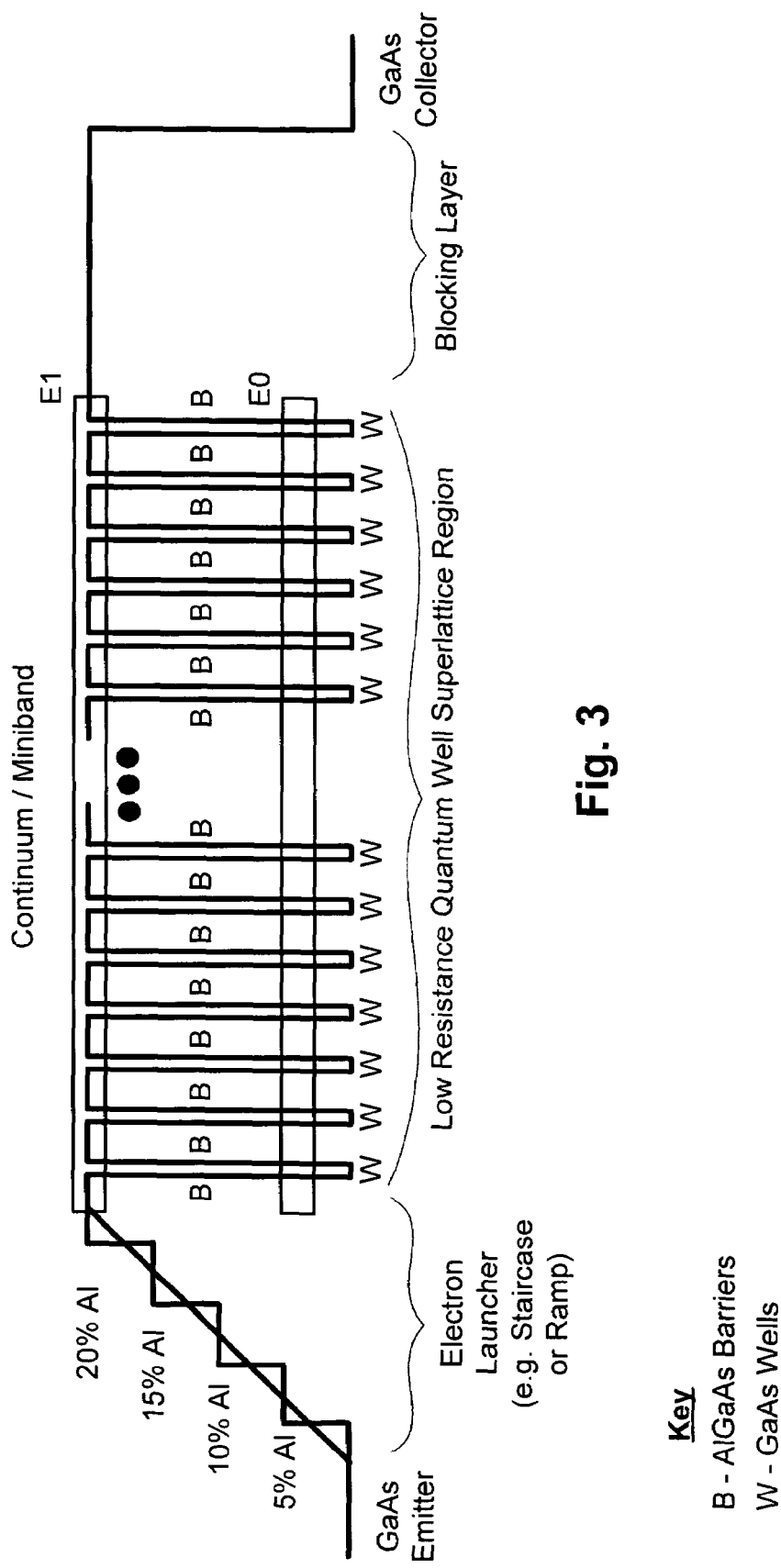
FIG. 3 is an energy-level diagram of a QWIP device configured with electron launching capability in accordance with another embodiment of the present invention.

FIG. 3 is an energy-level diagram of a QWIP device configured with electron launching capability in accordance with another embodiment of the present invention. This particular embodiment is similar to that discussed in reference to FIG. 2, in that it includes a GaAs emitter contact layer, an electron launcher, and a GaAs collector contact layer. The continuum, however, is configured as a superlattice miniband, and there is a blocking layer between the superlattice and the collector contact layer. The superlattice includes a number of wells and barrier layers just as the continuum in FIG. 2, except that the barrier layers here are thinner, and the number of wells may be greater.

The thinner barriers cause a substantial overlap of sub-level wave functions, which creates a miniband. Such a configuration allows tunneling between the wells near the emitter contact layer, thereby enabling very fast refilling of depleted wells and neutralization of space charge buildup. In addition, the substantial tunneling current that develops in the miniband is suppressed by the relatively thick, undoped blocking layer. Note that the thickness of the blocking layer also controls the dominant capacitance of the device. Generally stated, the thicker the blocking layer, the lower the overall device capacitance. In any such case, the electron launcher operates in conjunction with the blocked superlattice structure to provide excellent response times.

The number of quantum wells in the superlattice region can vary, but is typically about 40 to 50 wells. As previously explained, the number of barriers is generally one more than the number of wells, and the geometry of the wells and barriers can vary depending on the application and materials used. Here, the lattice matched material system GaAs/$Al_xGa_{1-x}As$ is used. In one particular embodiment, x is about 0.2, the width of the GaAs wells is about 80 Å, and the thickness of the AlGaAs barriers is about 40 Å. The AlGaAs blocking layer is about 500 Å to 600 Å thick. Note that the value of x for the barrier layers of the superlattice region can be different than the value of x associated with the blocking layer.

As previously stated, other configurations will be apparent in light of this disclosure, and the present invention is not intended to be limited to the example embodiment shown. Other material systems and structure geometries can be used to carry out the principles of the present invention. In addition, and as explained in the previously incorporated patent application titled, "QWIP with Enhanced Optical Coupling" various structural features of a QWIP can be configured to enhance its optical coupling to improve absorption capability and efficiency.

For example, a waffle-type light-coupling grating having a pattern of etched holes operates to improve absorption by preventing photons from bouncing out of the detector sensing areas. A post-type grating can be used here as well. Grating parameters, including orientation, pitch, and depth, can be adjusted to optimize specific color detection. Also, a hybrid metal layer including both ohmic and reflective qualities can be provided at the top of the sensing area to further improve quantum efficiency as well as conversion efficiency. A "photon-in-a-box" configuration is also provided, where sides of the QWIP sensing area are coated with reflective metal (e.g., Gold) to further prevent the escaping of photons, thereby further increasing absorption.

Furthermore, though the figures herein illustrate a conventional indirect-gap AlGaAs QWIP structure, other structure-types can equally employ the principles of the present invention. For instance, a strained InGaAs QWIP structure as described in the previously incorporated patent application titled, "QWIP with Enhanced Optical Coupling" can be used. Testing has shown that such a InGaAs/InAlAs/InP QWIP is two times (or more) better than a GaAs/AlGaAs structure with respect to both improved absorption (quantum efficiency) and higher speed (more gain). In addition, the strained-InGaAs/AlGaAs QWIP having the same quantum well depth as the GaAs/AlGaAs structure provides faster electron transport in low Al % AlGaAs barrier. Higher absorption is provided due to the lighter InGaAs well electron.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A quantum well infrared photodetector (QWIP) device comprising:
   an emitter contact layer;
   a stack including a number of quantum wells, each well sandwiched between barrier layers; and
   an electron launcher configured with a plurality of steps to enable dark electrons to move rapidly from the emitter contact layer into the stack, thereby reducing dielectric relaxation effect.

2. The device of claim 1 wherein a first baffler in the stack is defined by a particular semiconductor material make-up, and each step of the electron launcher adds about 25% or less of that first barrier's make-up.

3. The device of claim 1 wherein the device is configured as an indirect-gap type structure, and the quantum wells are GaAs and the barriers are AlGaAs.

4. The device of claim 1 wherein the device is configured as a strained type structure, and the quantum wells are InGaAs, and the barriers are AlGaAs.

5. The device of claim 1 wherein the quantum wells have a width of about 40 Å to 80 Å, and the barriers have a thickness of about 500 Å or more.

6. The device of claim 1 wherein the device further includes a collector contact layer that is proximate to a last barrier included in the stack.

7. The device of claim 6 wherein the device further includes a second electron launcher configured with a plurality of steps to enable dark electrons to rapidly move from the collector contact layer into the stack, thereby reducing dielectric relaxation effect during reverse bias applications.

8. The device of claim 6 wherein the device further includes a blocking layer between the stack and the collector contact layer for suppressing tunneling current from the quantum wells.

9. A quantum well infrared photodetector (QWIP) device comprising:
   a stack including a number of quantum wells, each well sandwiched between barrier layers; and
   an electron launcher configured with a plurality of steps to enable dark electrons to move rapidly from a contact layer into the stack, thereby reducing dielectric relaxation effect.

10. The device of claim 9 wherein a first barrier in the stack is defined by a particular semiconductor material make-up, and each step of the electron launcher adds about 25% or less of that first barrier's make-up.

11. The device of claim 9 wherein the device farther includes a blocking layer that is proximate to an end barrier of the stack for suppressing tunneling current from the quantum wells.

12. The device of claim 9 wherein the stack is configured to detect multiple wavelengths.

13. The device of claim 9 wherein the device further comprises:
   an emifter contact layer that is proximate to a first end barrier of the stack; and
   a collector contact layer that is proximate to a second end barrier of the stack.

* * * * *